United States Patent
Lee et al.

(10) Patent No.: US 6,759,305 B2
(45) Date of Patent: Jul. 6, 2004

(54) METHOD FOR INCREASING THE CAPACITY OF AN INTEGRATED CIRCUIT DEVICE

(75) Inventors: Chun-Tao Lee, Hsinchu (TW); Cheng-Chung Lee, Taitung (TW); Bing-Yue Tsui, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 135 days.

(21) Appl. No.: 10/122,188

(22) Filed: Apr. 16, 2002

(65) Prior Publication Data

US 2003/0100189 A1 May 29, 2003

(30) Foreign Application Priority Data

Nov. 28, 2001 (TW) .......................................... 90129368 A

(51) Int. Cl.[7] .............................................. H01L 21/20
(52) U.S. Cl. ........................................ 438/399; 257/309
(58) Field of Search ................................ 438/479, 483, 438/128, 255, 665, 398–399, 964; 313/309, 311; 257/309

(56) References Cited

U.S. PATENT DOCUMENTS

| | | | | |
|---|---|---|---|---|
| 5,973,444 A | * | 10/1999 | Xu et al. | 313/309 |
| 6,294,450 B1 | * | 9/2001 | Chen et al. | 438/597 |
| 6,448,701 B1 | * | 9/2002 | Hsu | 313/309 |
| 6,515,325 B1 | * | 2/2003 | Farnworth et al. | 257/296 |
| 6,542,400 B2 | * | 4/2003 | Chen et al. | 365/151 |

* cited by examiner

*Primary Examiner*—David Nelms
*Assistant Examiner*—David Vu
(74) *Attorney, Agent, or Firm*—Birch, Stewart, Kolasch & Birch, LLP

(57) ABSTRACT

A method for increasing the capacity of an integrated circuit device. The method includes the steps of defining a catalyst area on a substrate, forming a nanotube, nanowire, or nanobelt on the catalyst area, forming a first dielectric layer on the nanotube, nanowire, or nanobelt and the substrate, and forming an electrode layer on the first dielectric layer. According to above method, the capacity is substantially increased without extending the original bottom area of the capacitor electrode by using the surface area of the nanotube, nanowire, or nanobelt as the area of the capacitor electrode.

15 Claims, 3 Drawing Sheets

METHOD FOR INCREASING THE CAPACITY OF AN INTEGRATED CIRCUIT DEVICE

BACKGROUND OF THE INVENTION

1. Field of the Invention

The present invention relates in general to a method for increasing the capacity of an integrated circuit device. In particular, the present invention relates to a method for increasing the capacity of a DRAM (Dynamic Random Access Memory) using nanotubes, nanowires, or nanobelts.

2. Description of the Related Art

In prior art, a DRAM memory cell is composed of a transistor and a capacitor. With advances in technology, the size of a transistor has become smaller and smaller. But when the size of a transistor becomes smaller, the area of the capacitor electrode decreases. If the area of the capacitor electrode decreases, the capacity also decreases. However, in the DRAM memory cell, the capacity must high enough so as to maintain a predetermined voltage. Hence, in order to overcome the above problems, methods of increasing the surface area of the capacitor electrode to increase the capacity have been disclosed. This is generally accomplished by trenching and stacking. However, these methods require complicated processes so that the manufacturing cost cannot be reduced. increase the area of the capacitor electrode, the increase is still limited by photolithography limitations.

SUMMARY OF THE INVENTION

The present invention is intended to overcome the above-described disadvantages.

An object of the present invention is to provide a method for increasing the capacity of an integrated circuit (IC) device, including the steps of defining a catalyst area on a substrate, forming a nanotube, nanowire, or nanobelt on the catalyst area, forming a first dielectric layer on the nanotube, nanowire, or nanobelt and the substrate, and forming an electrode layer on the first dielectric layer.

According to above method of the present invention, the capacity is substantially increased by using the surface area of the nanotube, nanowire, or nanobelt as the area of the capacitor electrode without extending the original bottom area of the capacitor electrode. This successfully simplifies the process and decreases the manufacturing cost.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1A:
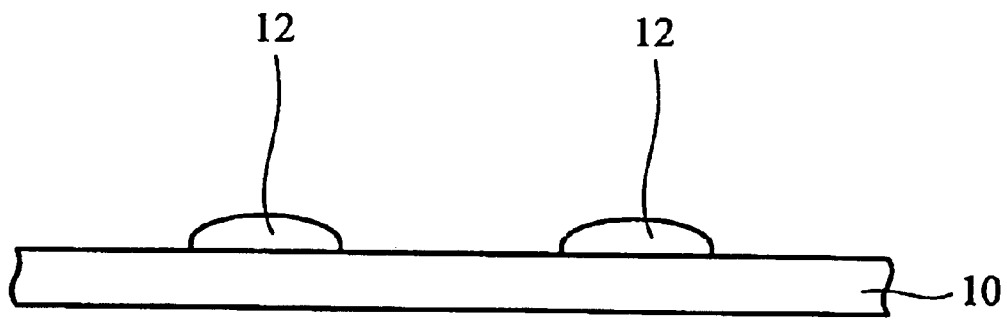
FIGS. 1a to 1f are sectional views showing an embodiment of the method for increasing the capacity of an integrated circuit device according to the present invention.

First, as shown in FIG. 1a, a catalyst area 12 is defined on a substrate 10. There are many ways to define the catalyst area 12 on a substrate 10. For example, a first way includes the steps of: dispersing a metal catalyst ion containing solution (not shown) on a predetermined area (above catalyst area 12) of the substrate 10, and executing an annealing step to gather the metal catalyst ion containing solution to become metal catalyst group. Thereby, the catalyst area 12 is defined. The metal catalyst ion containing solution, preferably, is a nickel ion containing solution or iron ion containing solution. A second way includes the steps of: implanting a metal catalyst on the predetermined area (above catalyst area 12) of the substrate 10. Therefore, the catalyst area 12 is defined. The metal catalyst, preferably, is nickel or iron. A third way includes the steps of: depositing a metal catalyst layer (not shown) on the substrate 10, and forming a photoresist layer having a predetermined pattern on the metal catalyst layer, and then executing a photolithography step to define the catalyst area 12. The metal catalyst layer, preferably, is composed of nickel or iron.

Figure 1B:
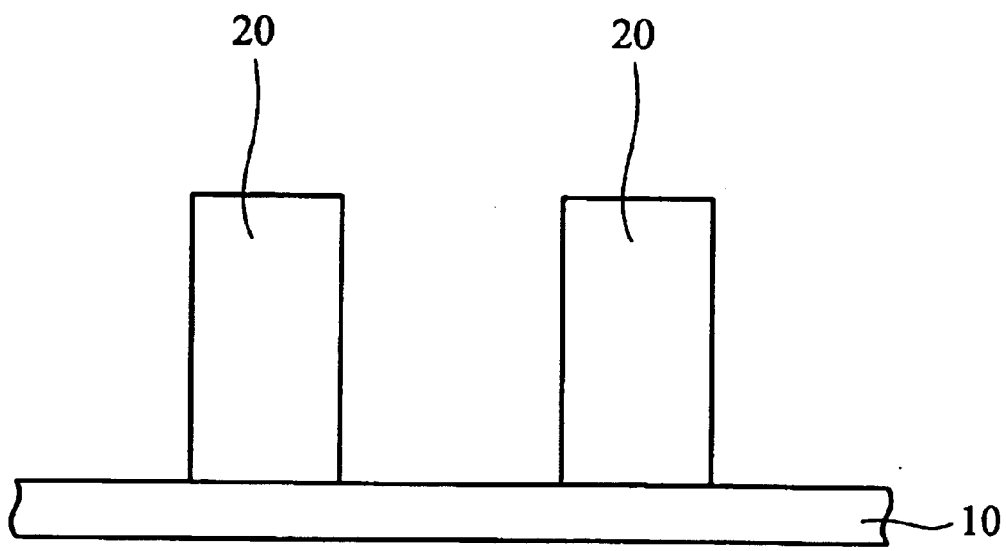

Secondly, as shown in FIG. 1b, a carbon nanotube 20 is formed on the catalyst area 12. The step of forming the carbon nanotube 20 on the catalyst area 12 is: introducing a cracking gas (not shown) on the catalyst area 12 by chemical vapor deposition (CVD) under a predetermined condition of plasma. Preferably, the cracking gas is methane ($CH_4$), ethane ($C_2H_6$), or carbon dioxide ($CO_2$).

Figure 1C:
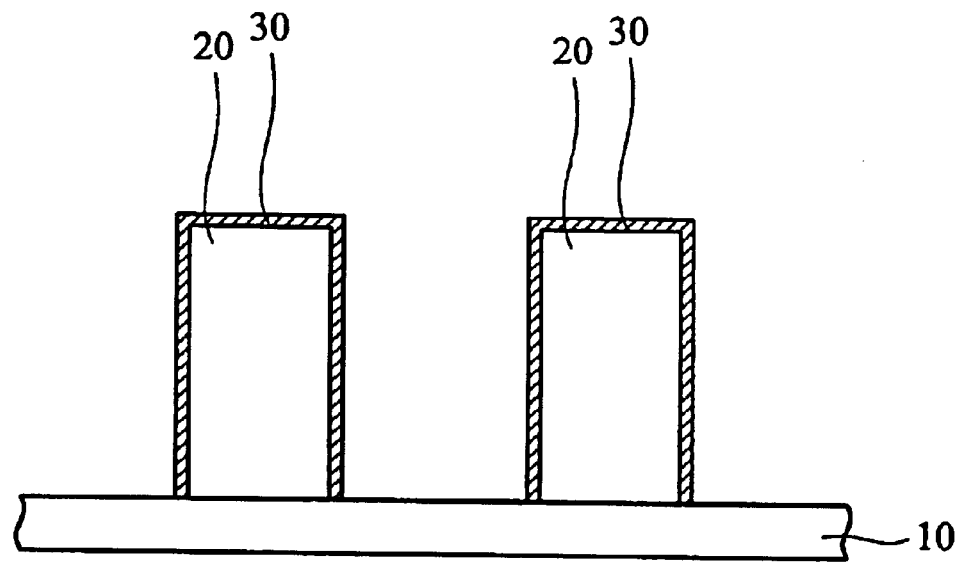
Figure 1D:
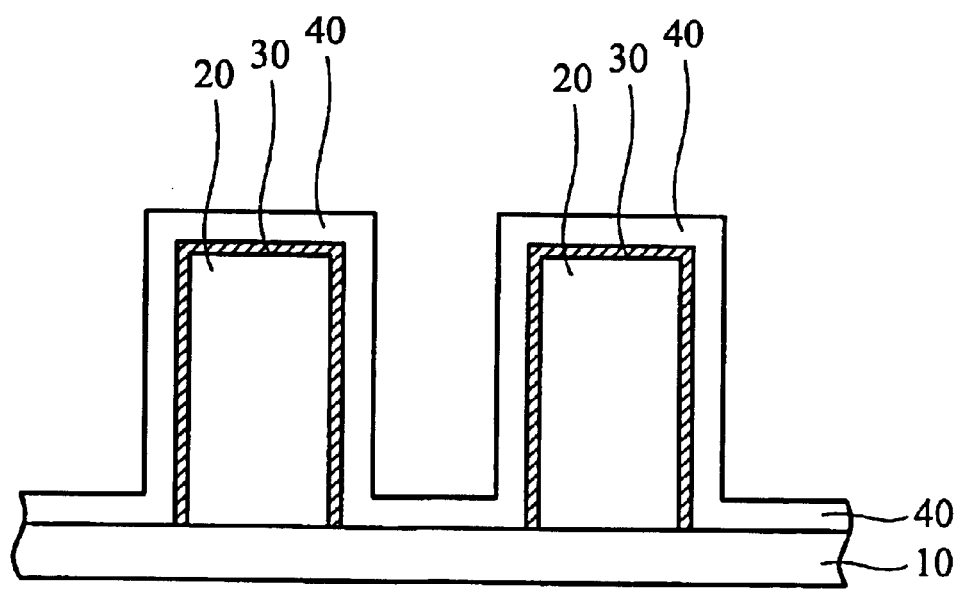

Moreover, a first dielectric layer 40 is deposited on the carbon nanotube 20 and the substrate 10. In this case, in order to increase the surface area of the carbon nanotube 20 and the adhesiveness between the carbon nanotube 20 and the first dielectric layer 40 at the same time, a metal layer 30 is preferably deposited on the carbon nanotube 20 before depositing the first dielectric layer 40 on the carbon nanotube 20, as shown in FIG. 1c. The first dielectric layer 40 is then deposited on the metal layer 30, as shown in FIG. 1d. The metal layer 30, is preferably deposited by sputtering.

Figure 1E:
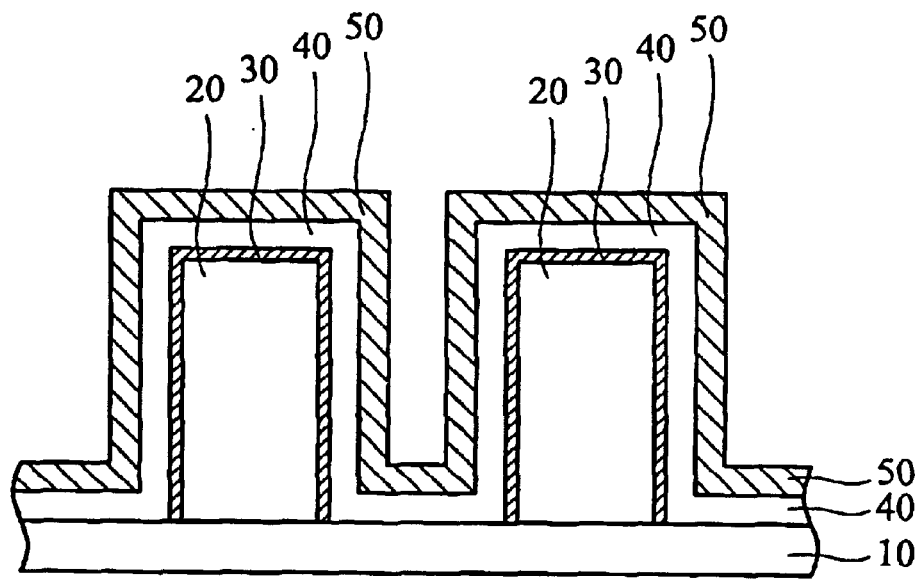

At last, as shown in FIG. 1e, an electrode layer 50 is deposited on the first dielectric layer 40.

As mentioned above, the carbon nanotube 20 is a carbon molecule tube with nanometer diameter possessing a high electric conductivity very close to that of metal and having a large aspect ratio. Therefore, depositing carbon nanotubes on the capacitor electrode surface of an integrated circuit device as the bottom electrode substantially increases the capacity without extending the bottom area of the capacitor electrode. The process is simple and has a low manufacturing cost. Moreover, when the above method is applied in DRAM, it increases the stability of data saving in memory cell because of the increased capacity. Further, the carbon nanotube 20 also can be replaced by any other nanotubes, or nanowire or nanobelt.

Figure 1F:
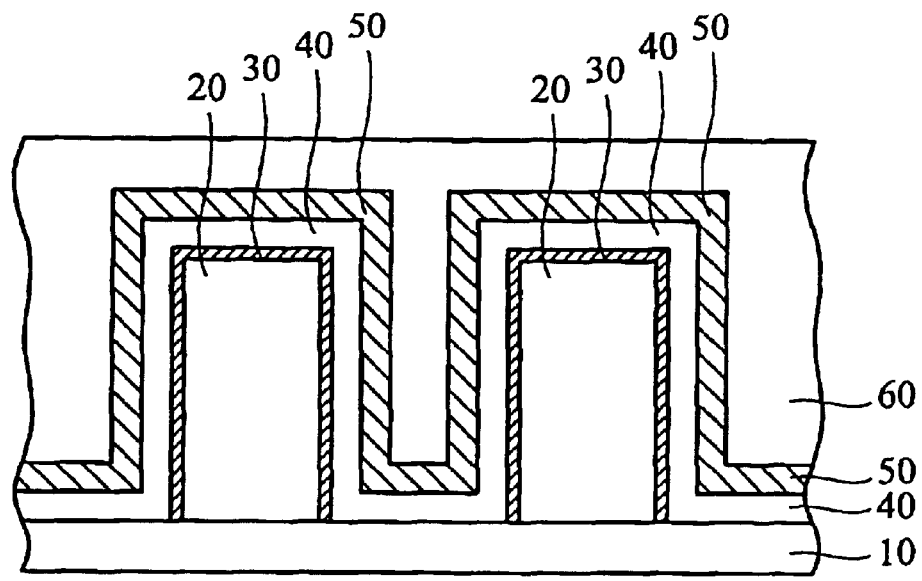

In addition, as shown in FIG. 1f, a second dielectric layer 60 can be deposited to cover the electrode layer 50. Moreover, the second dielectric layer 60 can be flattened.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for increasing the capacity of an integrated circuit device, comprising the steps of:

defining a catalyst area on a substrate;

forming at least one nanotube, nanowire, or nanobelt on the catalyst area;

forming a first dielectric layer on each nanotube, nanowire, or nanobelt and the substrate; and forming an electrode layer on the first dielectric layer of each nanotube, nanowire or nanobelt;

whereby said electrode layers act as a capacitor and increase the capacity of an integrated circuit device.

2. The method for increasing the capacity of an integrated circuit device as claimed in claim 1, further comprising the step of forming a metal layer between the nanotube, nanowire, or nanobelt and the first dielectric layer.

3. The method for increasing the capacity of an integrated circuit device as claimed in claim 1, further comprising the step of forming a second dielectric layer to cover the electrode layer.

4. The method for increasing the capacity of an integrated circuit device as claimed in claim 3, further comprising the step of flatting the second dielectric layer.

5. The method for increasing the capacity of an integrated circuit device as claimed in claim 1, wherein the steps of defining the catalyst area on the substrate further comprising the steps of:

dispersing a metal catalyst ion containing solution on a predetermined area of the substrate; and executing an annealing step.

6. The method for increasing the capacity of an integrated circuit device as claimed in claim 5, wherein the metal catalyst ion containing solution is a nickel ion containing solution.

7. The method for increasing the capacity of an integrated circuit device as claimed in claim 5, wherein the metal catalyst ion containing solution is a iron ion containing solution.

8. The method for increasing the capacity of an integrated circuit device as claimed in claim 1, wherein the step of defining the catalyst area on the substrate comprises the step of implanting a metal catalyst on a predetermined area of the substrate.

9. The method for increasing the capacity of an integrated circuit device as claimed in claim 8, wherein the metal catalyst is nickel.

10. The method for increasing the capacity of an integrated circuit device as claimed in claim 8, wherein the metal catalyst is iron.

11. The method for increasing the capacity of an integrated circuit device as claimed in claim 1, wherein the step of defining the catalyst area on the substrate comprises the steps of:

forming a metal catalyst layer on the substrate;

forming a photoresist layer on the metal catalyst layer; and executing a photolithography step.

12. The method for increasing the capacity of an integrated circuit device as claimed in claim 11, wherein the metal catalyst layer is composed of nickel.

13. The method for increasing the capacity of an integrated circuit device as claimed in claim 11, wherein the metal catalyst layer is composed of iron.

14. The method for increasing the capacity of an integrated circuit device as claimed in claim 1, wherein the step of forming the nanotube on the catalyst area comprises the step of introducing a cracking gas on the catalyst area using chemical vapor deposition under a predetermined condition of plasma.

15. The method for increasing the capacity of an integrated circuit device as claimed in claim 14, wherein the cracking gas is methane, ethane, or carbon dioxide.

* * * * *